United States Patent [19]

Klar et al.

[11] 4,400,637

[45] Aug. 23, 1983

[54] INTEGRATOR WITH SAMPLING STAGE

[75] Inventors: Heinrich Klar; Berward Roessler, both of Munich, Fed. Rep. of Germany

[73] Assignee: Siemens Aktiengesellschaft, Berlin & Munich, Fed. Rep. of Germany

[21] Appl. No.: 252,048

[22] Filed: Apr. 8, 1981

[30] Foreign Application Priority Data

Apr. 30, 1980 [DE] Fed. Rep. of Germany ....... 3016737

[51] Int. Cl.$^3$ ............................................. G06G 7/186
[52] U.S. Cl. ................................... 307/497; 307/520; 330/107; 328/127
[58] Field of Search ................ 328/127; 330/107, 109; 307/494, 497, 520

[56] References Cited

U.S. PATENT DOCUMENTS

| | | | |
|---|---|---|---|
| 3,906,214 | 9/1975 | Hess | 307/497 |
| 4,306,197 | 12/1981 | Gregorian | 330/107 |
| 4,338,571 | 7/1982 | Young | 330/107 |

OTHER PUBLICATIONS

IEEE Journal of Solid State Circuits vol. SC12 No. 6, Dec. 1977 pp. 592–599 "Sampled Analog Filtering Using Switched Capacitors as Resistor Equivalents" by Caves et al.

IEEE Journal of Solid-State Circuits, vol. SC-12, No. 6, Dec. 1977 entitled: "MOS Sampled Data Recursive Filters Using Switched Capacitor Integrators" pp. 600–608.

Primary Examiner—John S. Heyman
Attorney, Agent, or Firm—Hill, Van Santen, Steadman & Simpson

[57] ABSTRACT

An integrator with a sampling stage at the input side has a first capacitor with associated electronic switches and has one or more amplifier stages each having a feedback path containing a second capacitor which is connected to the output of the sampling stage. The integrator has a first polarity commutator interconnected between the output of the sampling stage and the input of the first amplifier stage and a second polarity commutator at the output of one of the amplifier stages, the second polarity commutator being operated synchronously with the first polarity commutator. By periodic actuation of the polarity commutators, the low frequency noise voltage components, having amplitudes which vary minimally within a polarity reversal period, cancel when the integration results of successive periods of opposite polarity are added and are thus substantially eliminated.

7 Claims, 8 Drawing Figures

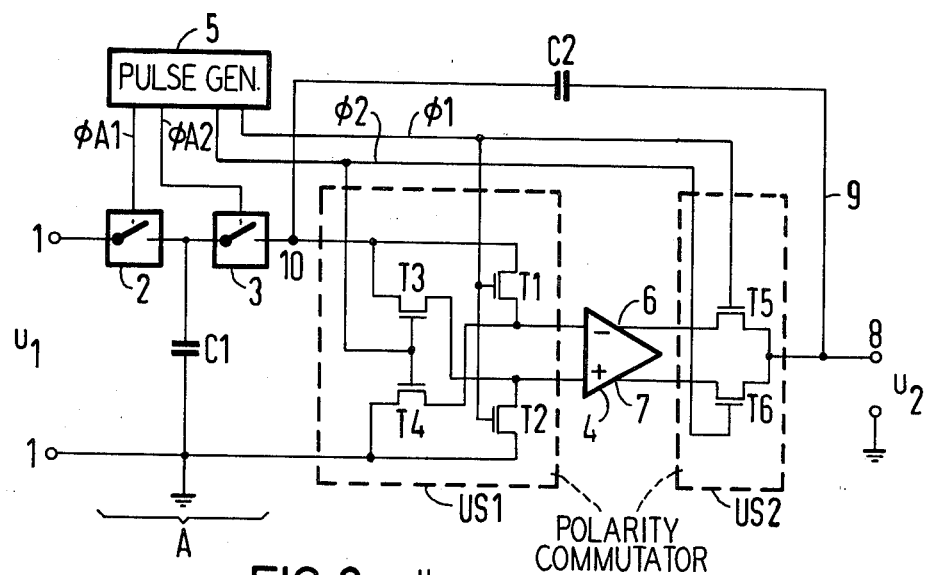
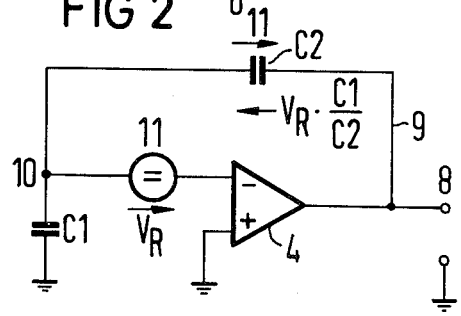
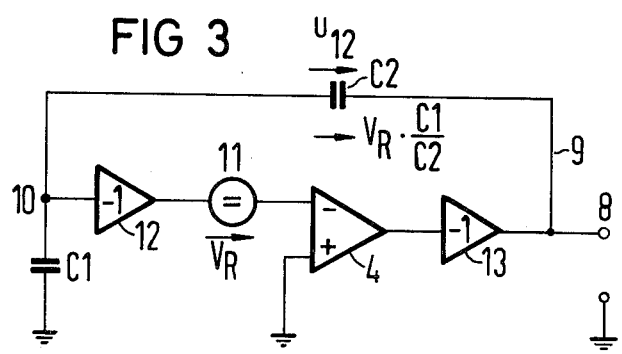

4,400,637

INTEGRATOR WITH SAMPLING STAGE

BACKGROUND OF THE INVENTION

1. Field of the Invention

The present invention relates to integrators with a sampling stage, and in particular, to such integrators employing a switched capacitor in the sampling stage.

2. Description of the Prior Art

Integrators which periodically sample an input signal which is to be integrated which make use of a switch capacitor in the sampling stage are known from IEEE Journal of Solid-State Circuits, Vol. SC-12, No. 6, December, 1977, at pages 600–608, particularly FIG. 2(b). In such devices, within each sampling period a portion of the noise voltages generated in the amplifier stages is supplied to the capacitance which is disposed in the feedback path. The periodically supplied noise voltage components accumulate and thus considerably falsify the integration result. In embodiments utilizing a number of amplifier stages, the integration error resulting from the noise voltages associated with the first amplifier stage contributes the greatest amount to the overall error, for the reason that those noise voltages are subjected to the greatest amplification. It is a problem of devices such as those described above to reduce the influence of the noise voltages generated in the amplifier stages on the integration result.

SUMMARY OF THE INVENTION

It is an object of the present invention to provide an integrator with a switched-capacitor sampling stage which significantly reduces the influence of noise voltages generated in the amplifier stages on the overall integration result.

The above object is inventively achieved in an integrator with a sampling stage which has first and a second polarity commutators which are periodically actuated so that the low frequency noise voltage components, which have amplitudes which change only minimally during a polarity reversal period, are effectively cancelled when the integration results of successive integrations carried out with the signal at opposite polarities are added. The noise voltage components are thus substantially eliminated.

The first polarity commutator is interconnected between the sampling stage and the input to a first amplifier stage in the integrator. The second polarity commutator is connected at the output of the first amplifier stage if the integrator has more than one amplifier stage, at the output of any one amplifier stage.

Other embodiments and modifications of the invention will be apparent to those skilled in the art based on the detailed description below with reference to the drawings.

DESCRIPTION OF THE DRAWINGS

FIG. 1 is a circuit diagram of an integrator with a sampling stage including a polarity commutator constructed in accordance with the principles of the present invention.

FIG. 2 is an equivalent circuit for the circuit shown in FIG. 1 in a first operating state.

FIG. 3 is an equivalent circuit for the circuit shown in FIG. 1 in a second operating state.

DESCRIPTION OF THE PREFERRED EMBODIMENTS

Figure 4:
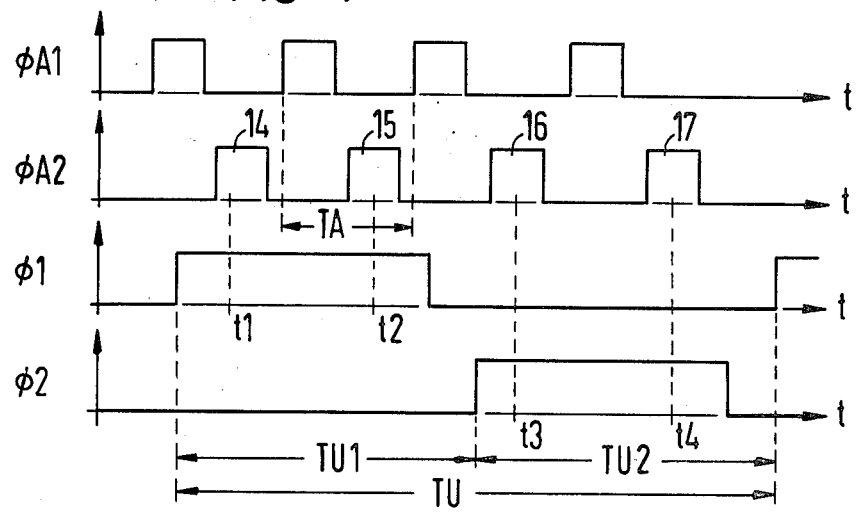
FIG. 4 is a voltage/time diagram for explaining the operation of the circuit of FIG. 1.

An integrator with a sampling stage is shown in FIG. 1 which is supplied with a signal voltage $u_1$ at input terminals 1. The input signal is supplied to a capacitor C1 through a first electronic switch 2 so that the capacitor C1 is charged to the signal value existing at the sampling time. After the switch 2 has been opened, a second electronic switch 3 is then closed, so that the signal value stored in C1 is transferred to the inputs of an operational amplifier 4 which is a differential amplifier. The upper terminal of the capacitor C1 is connected to the negative input of the amplifier 4 through a conducting field effect transistor T1, whereas the lower terminal of the capacitor C1, which lies at the reference potential, is connected to the positive input of the amplifier 4 through a conducting field effect transistor T2. The transistors T1 and T2 are switched between conducting and non-conducting states by means of a clock voltage $\phi 1$ delivered by a clock voltage generator 5 and supplied to the respective gate electrodes of T1 and T2. Through their respective source-drain segments, two further field effect transistors T3 and T4 connect the terminals of C1 to the inputs of the amplifier 4 in such a manner that the signal value stored in the capacitor C1 is reversed in comparison to the signals first supplied to the amplifier 4. This is achieved by switching the transistors T3 and T4 by a clock voltage $\phi 2$, also supplied by the pulse generator 5. The electronic switches 2 and 3 may similarly consist of field effect transistors which are respectively actuated by clock voltages $\phi A1$ and $\phi A2$.

The electronic switches 2 and 3 and the capacitor C1 form a stage designated at A for periodically sampling the input signal $u_1$ and are designated in the literature and known to those skilled in the art as a "switched capacitor" circuit. The transistors T1 through T4 represent a polarity commutator designated at US1 which is post-connected to the sampling stage A.

The differential amplifier 4 has a negative output 6 and a positive output 7 at which respective voltages with different operational signs in comparison to the reference potential occur. The output 6 is connected through a conducting field effect transistor T5 to the output 8 of the integrator, whereas the output 7 is connected to the output 8 through a conducting field effect transistor T6. The alternately conducting transistors T5 and T6 represent a second polarity commutator designated as US2. A feedback path 9 which includes an integrator capacitor C2 is switched between the output 8 and the output 10 of the sampling stage A.

The operation of the circuit shown in FIG. 1 will be further explained by the use of the equivalent circuits shown in FIGS. 2 and 3 representing different operating states of the circuit. The equivalent circuit shown in FIG. 2 represents an equivalent circuit for the case in which the second switch 3 is closed and the transistors T1, T2 and T5 are conducting as a result of the $\phi 1$ signal. The noise voltages resulting from the operational amplifier 4 are represented by means of an auxiliary voltage source 11 which is connected in series with the negative input of the amplifier 4. If it is assumed that the time span for which the equivalent circuit of FIG. 2 applies is so brief that the noise voltages within the time span do not significantly change, the voltage source 11 can be inerpreted as a constant voltage source which emits a voltage $V_R$. The voltage source 11 charges the capacitor C1 and a capacitive charging current flows across C2 which charges the capacitor C2 to the voltage $V_R \cdot (C1/C2)$ with a polarity indicated by the arrow. At the same time, a sampled value $u_{11}$ of the signal voltage $u_1$ stored in C1 is transmitted to the capacitor C2 with the indicated polarity.

The equivalent circuit for the state in which the switch 3 is closed and the transistors T3, T4 and T6 are conducting, by operation of the signal $\phi 2$, is shown in FIG. 3 during which time the transistors T1, T2 and T5 are non-conducting. The switch positions of the polarity commutators US1 and US2, which are respectively opposite those shown in FIG. 2, are represented in FIG. 3 by inverters 12 and 13. If one assumes that the noise voltage $V_R$ in the time span for which the equivalent circuit of FIG. 3 applies does not significantly change in comparison to the time span associated with the equivalent circuit in FIG. 2, the same assumptions can be made regarding the equivalent voltage source 11 as were made in connection with FIG. 2. The capacitor C2 is again charged as a result of the noise voltage component $V_R \cdot (C1/C2)$, however, because of the inverter 13, the charging ensues with the polarity indicated in FIG. 3 which is opposite to the polarity shown in FIG. 2. A sampled value $u_{12}$ is stored in the capacitor C1, which differs slightly from $u_{11}$ but which has the same polarity as $u_{11}$, is transmitted with the indicated polarity to the capacitor C2 which, because of the mutually compensating influences of the inverters 12 and 13, corresponds to the polarity of $u_{11}$ in FIG. 2.

With the time-dependency of the clock voltages $\phi A1$, $\phi A2$, $\phi 1$ and $\phi 2$ as shown in FIG. 4, the equivalent circuit shown in FIG. 2 corresponds to the reversal operations at points in time t1 and t2, whereas the equivalent circuit shown in FIG. 3 corresponds to the reversal operations occurring at points in time t3 and t4.

A sampling period is referenced in FIG. 4 with TA, and a reversal period is referenced with TU. A reversal period TU is subdivided into a first half period TU1 and a second half period TU2. If the noise voltage of the amplifier 4 changes only insignificantly within a period TU, the capacitor C2, given a clock diagram according to FIG. 4, is charged during TU1 to a noise voltage component $V_R \cdot (C1/C2)$ and is charged during TU2 with a noise voltage component which has the same magnitude but an opposite polarity, so that a high degree of cancellation of the noise voltages occurs during the overall period TU. In contrast, a summation of the respective sampled values of the signal voltage $u_1$ stored in the capacitor C1 during the individual sampling periods TA occurs within a period TU. Thus, as shown in FIG. 4, a total of two sampled values $u_{11}$ are transmitted to the capacitor C2 within the half period TU1 during the duty time of the clock pulses 14 and 15, just as a total of two sampled values $u_{12}$ are transmitted to the capacitor C2 during the second half period TU2 during the duty times of the clock pulses 16 and 17. Thus, for each reversal period TU, four sampled values of the signal voltage $u_1$ are added to result in the integrator output voltage $u_2$, shown in FIG. 1, occurring in the capacitor C2, whereas the noise voltage influences are largely suppressed at the output 8.

If, deviating from FIG. 4, the ratio of TA:TU is selected at 1:n, whereby n is a positive integer, the respective n sampled values of $u_1$ add in a reversal period TU, whereas the noise voltage components respectively added to the sampled values during the first half periods TU1 are again subtracted in the second half periods TU2. It is necessary, however, that the frequencies of the noise voltages must be far below the reversal frequency 1/TU. This is the case, for example, for the so-called 1/f noise of operational amplifiers whose frequencies generally are below 10 kHz. The sampling frequency 1/TA may be approximately 200 kHz, whereas the frequency range of the signal voltage $u_1$ has an upper limit of approximately 5 kHz. Within these limitations, the reversal frequency may be, for example, in the range of 10 through 100 kHz.

Figure 5:
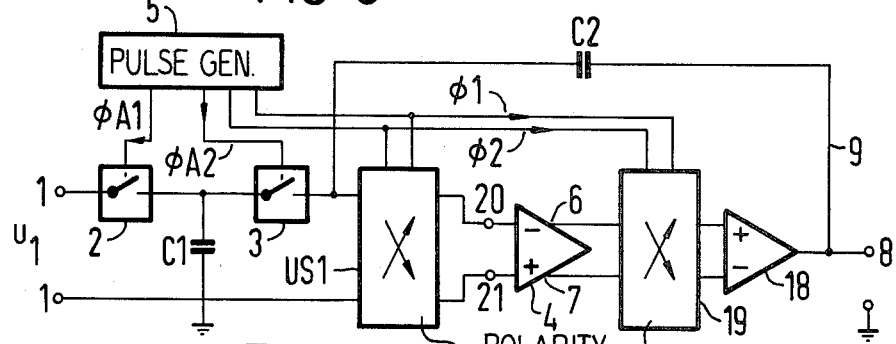
FIG. 5 is a second embodiment of the circuit shown in FIG. 1.

A second embodiment of the invention disclosed herein is shown in FIG. 5 which differs from the circuit shown in FIG. 1 by the addition of another differential amplifier 18. The amplifier stage 18 has a single monopole output at reference potential. The inputs of the differential amplifier 18 are connected to the outputs 6 and 7 of the amplifier 4 through a polarity commutator 19 which is constructed as the commutator US1.

Figure 6:
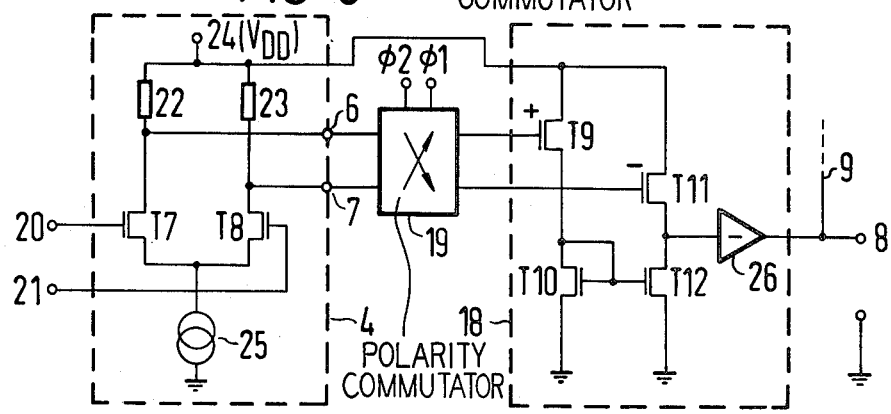
FIG. 6 is a detailed circuit diagram of a portion of the circuit shown in FIG. 5.

That portion of the circuit of FIG. 5 which is between the inputs 20 and 21 to the amplifier 4 and the output 8 of the integrator is shown in greater detail in FIG. 6. The differential amplifier 4 contains two field effect transistors T7 and T8 having respective gate electrodes connected to the inputs 20 and 21. The respective drain terminals of those transistors are connected across load elements 22 and 23 to a terminal 24 which is connected to a supply voltage $V_{DD}$. The source terminals of the two transistors are connected to one another and are connected to a constant current source 25 having one pole at reference potential. The negative output 6 of the amplifier 4 is connected to the node between the transistor T7 and the load element 22, and the positive output 7 of the amplifier 4 is connected to the node between the load element 23 and the transistor T8. The load elements 22 and 23 may be sheet resistances or may consist, for example, of field effect transistors whose gate electrodes are connected to their source terminals.

Figure 7:
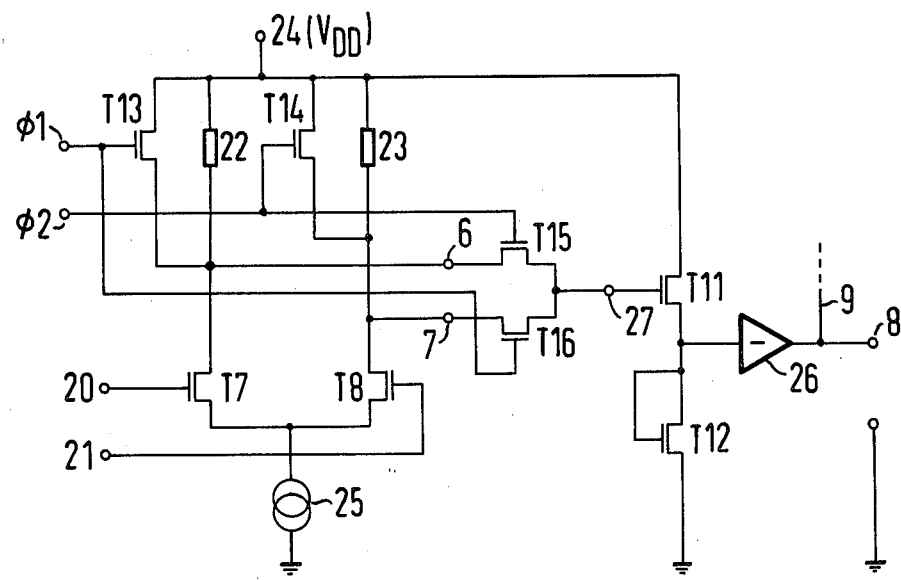
FIG. 7 is a third embodiment of the circuit shown in FIG. 1.

The differential amplifier stage 18 contains a field effect transistor T9 having a gate terminal which represents the positive input for the amplifier stage. The drain terminal of the transistor T9 is connected to the terminal 24, whereas the source terminal is connected to reference potential through the source-drain segment of a field effect transistor T10. The gate and drain terminals of the transistor T10 are connected to one another. The negative input of the amplifier stage 18 is formed by the gate terminal of a further field effect transistor T11 whose drain terminal is connected to the terminal 24. The source terminal of the transistor T11 is connected through the source-drain segment of a field effect transistor T12 to reference potential, and the gate of transistor T12 is connected to the gate of the transistor T10. The node between the source-drain segments of the transistors T11 and T12 is connected to the output 8 of the integrator through an inverter 26. A third embodiment of the basic circuit is shown in FIG. 7 which differs from the circuit shown in FIG. 6 in that respective field effect transistors T13 and T14 are connected in parallel to the load elements 22 and 23. The gate terminals of the field effect transistors T13 and T14 are respectively supplied with the clock voltages $\phi 1$ and $\phi 2$. A field effect transistor T15 is connected between the negative output 6 of the differential amplifier 4 and the gate terminal 27 of the transistor T11, and a field effect transistor T16 is connected between the positive output 7 of the amplifier 4 and the gate terminal 27. The voltages $\phi 2$ and $\phi 1$ are respectively supplied to the gate terminals of the transistors T15 and T16. The transistors T9 and T10 are thus omitted and the gate and drain terminals of the transistor T12 are connected. Upon the occurrence of each pulse in the clock voltage $\phi 2$, the output 6 is connected through the transistor T15 to the terminal 27 so that at the same time the load element 23 is bridge, whereas, upon occurrence of each voltage pulse in the clock voltage $\phi 1$, the output 7 is connected through the transistor T16 to the terminal 27 and the load element 22 is bridged. The transient response of the integrator is significantly improved by the embodiment shown in FIG. 7.

Figure 8:
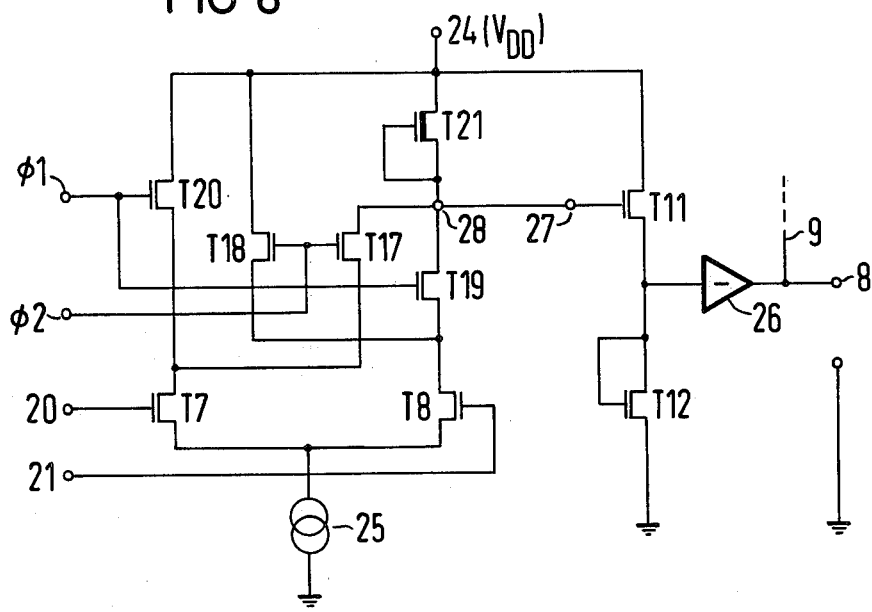
FIG. 8 is a fourth embodiment of the circuit shown in FIG. 1.

A fourth embodiment is shown in FIG. 8 which differs from the embodiment shown in FIG. 7 in that the polarity commutator, consisting of transistors T15 and T16, as well as the transistors T13 and T14, are replaced by the field effect transistors T17, T18, T19 and T20 provided in the differential amplifier. The two load elements 22 and 23 are replaced in the circuit shown in FIG. 8 by a single load element which consists of a field effect transistor T21 of the depletion type having a gate and source terminal which are connected. Upon occurrence of each pulse of the clock voltage $\phi 2$, the load element T21 is connected in series through the conducting transistor T17 to the transistor T7, whereas the drain terminal of the transistor T8 is connected to the terminal 24 through the transistor T18. Thus, the circuit node 28 assumes the function of the output 6 in FIG. 7. Upon the occurrence of a voltage pulse in the clock voltage $\phi 1$, the transistor T21 is connected in series through the transistor T19 to the transistor T8, whereas the transistor T7 is connected through the transistor T20 to the terminal 24. In this case, the circuit node 28 corresponds to the output 7 of FIG. 7. In this embodiment, the circuit node 28 may be directly connected to the terminal 27 without changing the operating mode of the integrator.

The amplifier stages 4 and/or 18 may be replaced by a plurality of amplifier stages without departing from the inventive concepts disclosed herein. If the circuitry is realized by the use of field effect transistors manufactured by n-channel technology, all voltages including the supply voltage $V_{DD}$ have a positive operational sign, whereas negative voltages are required for realization of the circuit in p-channel technology.

Circuits constructed in accordance with the inventive principles disclosed herein are particularly suitable for use as integrators in monolithic filters as are described, for example, in the previously-discussed IEEE Journal article. Although other uses and modifications may be apparent to those skilled in the art it is the intention of the inventors to embody within the patent warranted hereon all changes and modifications as reasonably and properly come within the scope of their contribution to the art.

We claim as our invention:

1. An integrator with a switched - capacitor sampling stage at the input of said integrator, said sampling stage having a first capacitor having one lead interconnected between first and second alternatingly opened electronic switches and said integrator having at least one amplifier stage having a feedback path containing a feedback capacitor which is connected to an output of said sampling stage, said integrator further comprising:

a first polarity commutator interconnected between the output of the sampling stage and an input of a first amplifier stage, said first polarity commutator selectively switching the polarity of a first signal supplied from said sampling stage for forming a first commutator output signal which is supplied to said input of a first amplifier stage, the polarity of said first commutator output signal being the same as or the opposite of the polarity of said first signal depending on the switching state of said first polarity commutator;

a second commutator connected to an output of at least one of said amplifier stages for selectively switching the polarity of an amplifier output signal appearing at the output of said one of said amplifier stages, said amplifier output signal being derived from said first commutator output signal through said first amplifier stage and any following amplifier stages including said one of said amplifier stages, said amplifier output signal being transformed by said second polarity commutator for forming a second commutator output signal, the polarity of said second commutator output signal being the same as or opposite the polarity of said amplifier output signal depending on the switching state of said second polarity commutator;

said feedback path being connected to an output of said second polarity commutator for supplying said second commutator output signal to said feedback capacitor; and a clock means connected to said first and second electronic switches and to said first and second polarity commutators for alternatingly opening and closing said first and second switches for forming a polarity of said first signals, and for operating said first and second polarity commutators for switching the polarities of said first signals and said amplifier output signals derived therefrom for mutually compensating the influences of said first and second polarity commutators on said second commutator output signals, said second commutator output signals being summed by said feedback capacitor for forming an output signal for said integrator such that noise voltages from said first amplifier stage have respective repeatedly switched polarities depending on the sequence of switching states of said second polarity commutator, thereby being substracted from each other by said feedback capacitor so as to be suppressed.

2. The integrator of claim 1 wherein said second polarity commutator is connected at the output of said first amplifier stage.

3. The integrator of claim 1 wherein said second polarity commutator is connected to a positive and a negative output of an amplifier stage which is a differential amplifier and to an asymmetrical input of a following amplifier stage, said asymmetrical input being alternatingly connected to one of said positive and negative outputs of said differential amplifier.

4. The integrator of claim 3 wherein said differential amplifier consists of:

a pair of amplifier transistors connected to a common current source and each connected to a supply voltage through a series load element; and a pair of switches connected in parallel across said load elements and operable by said clock means for alternatingly bridging said load elements.

5. The integrator of claim 3 wherein said differential amplifier consists of:
- a pair of amplifier transistors connected to a common current source;
- a load element connected in series through a first switching transistor with one of said amplifier transistors and connected in series through a second switching transistor with the other of said amplifier transistors;
- a third switching transistor interconnected between the said one of said amplifier transistors and a supply voltage;
- a fourth switching transistor interconnected between the other of said amplifier transistors and said supply voltage, said first and fourth switching transistors being simultaneously operated and said second and third switching transistors being simultaneously operated by said clock means.

6. The integrator of claim 1 wherein said first and second polarity commutators each consist of a plurality of field effect transistor switches alternatingly operated by said clock means and each having a source-drain segment in a current path connecting the inputs of said polarity commutators to the outputs thereof.

7. The integrator of claim 1 wherein said sampling stage has a sampling period and wherein a period between polarity reversals of said polarity commutator is equal to one or more sampling periods and wherein said polarity commutators are actuated during a switching state of said sampling stage during which said first capacitor storing a sampled signal is disconnected from the input of said first amplifier stage.

* * * * *